United States Patent

Sakata et al.

[11] Patent Number: 5,556,275
[45] Date of Patent: Sep. 17, 1996

[54] HEAT TREATMENT APPARATUS

[75] Inventors: Kazunari Sakata, Sagamihara; Kenji Tago, Kofu; Mitsuo Mizukami, Sagamihara, all of Japan

[73] Assignees: Tokyo Electron Limited, Tokyo; Tokyo Electron Tohoku Limited, Esashi, both of Japan

[21] Appl. No.: 317,653

[22] Filed: Sep. 30, 1994

[30] Foreign Application Priority Data

Sep. 30, 1993 [JP] Japan .................................. 5-268274
Dec. 24, 1993 [JP] Japan .................................. 5-347532

[51] Int. Cl.$^6$ .................................................. F27D 3/12
[52] U.S. Cl. .................. 432/241; 432/5; 432/6; 432/152; 432/239; 432/245
[58] Field of Search .......................... 432/5, 6, 152, 432/239, 241, 245

[56] References Cited

U.S. PATENT DOCUMENTS

| | | | |
|---|---|---|---|
| 5,000,682 | 3/1991 | Heidt et al. ................................. | 432/6 |
| 5,207,573 | 5/1993 | Miyagi et al. ........................... | 432/241 |
| 5,249,960 | 8/1993 | Monoe ..................................... | 432/241 |
| 5,277,579 | 1/1994 | Takanabe ................................. | 432/6 |
| 5,316,472 | 5/1994 | Niino et al. ............................. | 432/241 |
| 5,429,498 | 7/1995 | Okase et al. ............................. | 432/6 |

Primary Examiner—Henry A. Bennett
Assistant Examiner—Siddharth Ohrl
Attorney, Agent, or Firm—Oblon, Spivak, McClelland, Maier & Neustadt, P.C.

[57] ABSTRACT

A heat treatment apparatus comprising a holder, a hollow cylindrical cover, a flat plate, and a processing chamber. The holder holds disk-shaped objects, each having an orientation flat portion at circumference. The objects are arranged coaxially and spaced at predetermined intervals, with the orientation flat portions aligned with one another. The cover has gas ports and surrounds the objects held by the holder and is spaced from a circumference of each object by a predetermined distance. The flat plate is mounted on an inner surface of the cover and opposes the orientation flat portions of the objects. In the processing chamber, the objects held by the holder are processed by using a process gas.

19 Claims, 10 Drawing Sheets

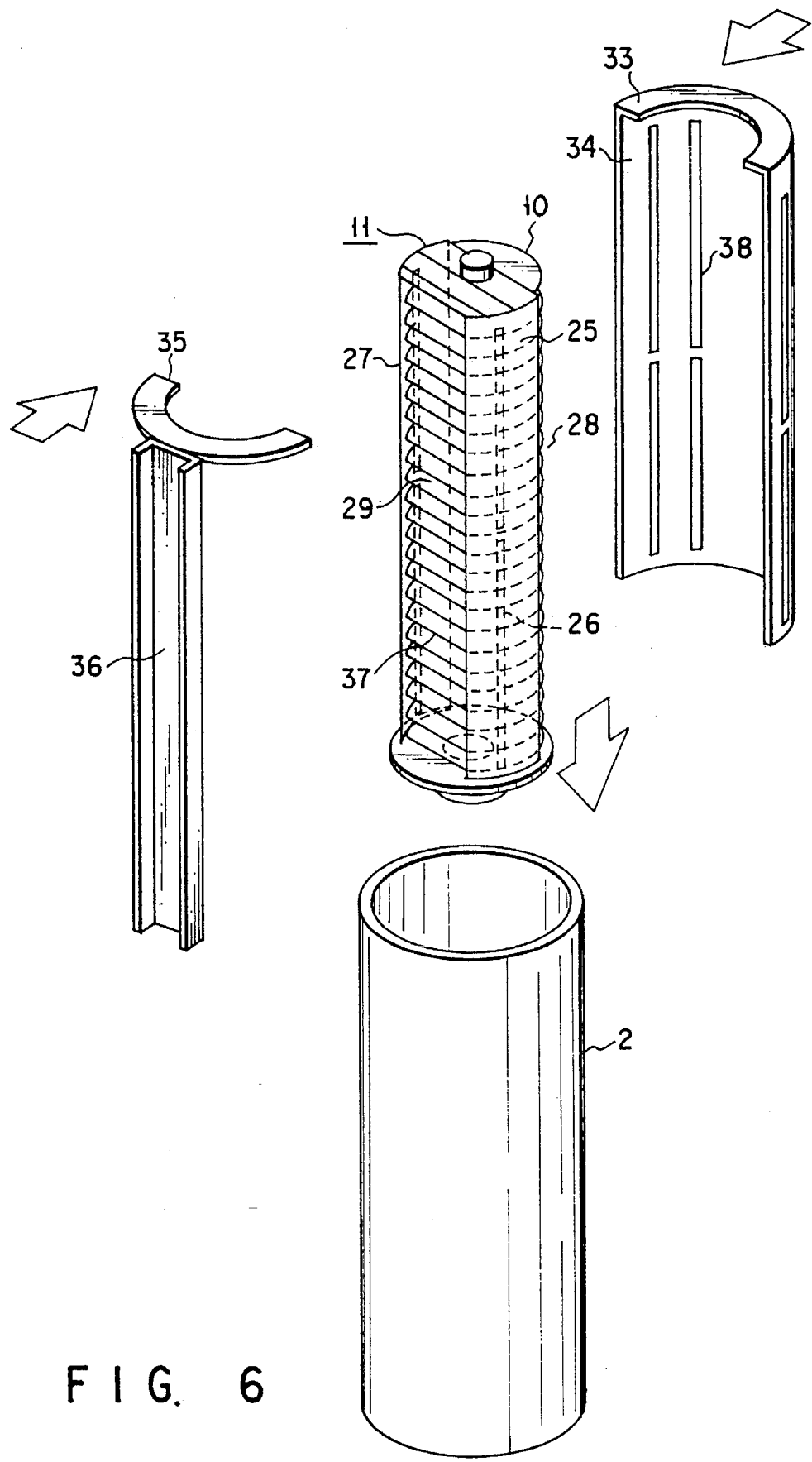
F I G. 6

HEAT TREATMENT APPARATUS

BACKGROUND OF THE INVENTION

1. Field of the Invention

The present invention relates to a heat treatment apparatus for performing a prescribed heat treatment on objects.

2. Description of the Related Art

Various apparatuses for performing prescribed heat treatments on objects are known. They are used in methods of manufacturing semiconductor devices. Among these apparatuses are: an apparatus for forming an oxide film on a semiconductor wafer; a CVD (Chemical Vapor Deposition) apparatus for forming thin films on a semiconductor wafer; and a thermal diffusion apparatus for diffusing impurities into a semiconductor wafer, thereby to form impurity regions therein.

There are two types of CVD apparatuses. The first is known as "horizontal type," and the second type as "vertical type." Recently popular is the vertical type which has a vertical processing chamber shaped like a hollow cylinder. In operation, a wafer boat (hereinafter called "boat") containing a number of wafers is inserted into the processing chamber. The processing chamber is heated, creating a high-temperature atmosphere in it. Then, a prescribed process gas is introduced into the chamber. Each wafer is thereby subjected to CVD in the high-temperature atmosphere, and a thin film is formed on the wafer. Here arises a problem. The thin film is thicker at the circumferential portion than at the center portion, inevitably because the gas is applied to each wafer from the circumferential portion to the center portion. Namely, the film cannot have thickness uniformity.

The thickness uniformity of a film is calculated by various methods. One method is to measure thickness of selected portions of the film, and then to divide the difference in the maximum and minimum thicknesses measured by two times the average thickness of the selected portion. Another method is to measure thickness of selected portions of the film, and to use the standard deviation of the thicknesses measured of these portions. The smaller the value thus calculated, the higher the thickness uniformity.

In the process of forming a film on a semiconductor wafer it is important to increase the thickness uniformity of the film in order to manufacture a semiconductor device which has stable electric characteristics. One method of improving the thickness uniformity is to use a so-called "basket-shaped boat cover." A basket-shaped boat cover is a hollow cylindrical cover made of quartz and designed to cover a boat which contains semiconductor wafers. The boat cover has a number of holes or slits through which a process gas can flow into the boat.

When the wafers in the boat are subjected to film-forming process while the boat is being covered by the boat cover, the active component of the process gas forms a film on the boat cover. The film thus formed on the boat cover controls the moderately active component of the gas, which flows into the boat through the holes of the cover and which is ultimately applied onto the surface of each wafer contained in the boat. Thus controlled, the moderately active component of the process gas forms on each wafer a film which has a sufficiently high thickness uniformity.

The use of a boat cover is disclosed in, for example, Jpn. Pat. Appln. KOKAI Publication No. 4-206629 and Jpn. UM Appln. KOKAI Publication No. 2-131549. To form a film having increased thickness uniformity on a semiconductor wafer, it is desirable that the gap between the boat cover and each semiconductor wafer be uniform and narrow. To this end, a part of the boat cover may be attached firmly to the boat, as is described in Jpn. UM Appln. KOKAI Publication No. 2-131549.

Despite such use of a boat cover as described above, that portion of the film on each wafer is slightly thicker or thinner at the orientation flat portion than at any other portion of the wafer. This impairs the thickness uniformity of the film, and eventually results in a low yield of semiconductor IC chips. It is therefore demanded that a film be formed on the surface of a wafer, which has the same thickness at the orientation flat portion of the wafer as at any other portion thereof.

Recent progress in microtechnology has increased the integration density of semiconductor devices. In the case of dynamic random-access memories (DRAMs), 4M-DRAMs are now manufactured in large quantities, and techniques are being developed for manufacturing DRAMs of higher integration density, i.e., 16M-DRAMs and 64M-DRAMs. Therefore it has become important how to reduce the number of dust particles which may adhere to a semiconductor wafer in the process of manufacturing high-integration IC chips.

In the sate of the art, semiconductor wafers are transferred to a boat by means of a transfer arm having a wafer holder. The wafer holder has a hole having two ends, the first end opening in the top surface and the second end connected to a vacuum pump. The hole is evacuated when the vacuum pump is driven, whereby a wafer is attracted and held onto the top surface of the wafer holder. Then, the transfer arm is actuated, with the wafer holder holding the wafer, transferring the wafer to the boat. However, this transfer of wafers to a boat increases the number of dust particles which adhere to each semiconductor wafer—in two ways. First, as the wafer is attracted to the wafer holder by virtue of a relatively large suction force, it may be damaged, generating dust. Second, as the suction force is applied on the wafer, many dust particles in the ambient atmosphere are attracted onto that surface of the wafer which faces away from the surface contacting the wafer holder. The dust particles on the wafer will float in the air and adhere again to the wafer or to the adjacent wafers, during any subsequent step of manufacturing semiconductor devices. They will ultimately decrease the yield of the semiconductor devices.

As described above, in the case where a wafer is transferred to a boat by a transfer arm and is covered by a boat cover in the process of forming a thin film on the wafer, dust particles adhere to the wafer and the wafer is thicker or thinner, though slightly, at the orientation flat portion than at any other portion of the wafer. Semiconductor devices will be manufactured from the wafer but at a low yield.

SUMMARY OF THE INVENTION

The object of the present invention is to provide a heat treatment apparatus which can form a film having high thickness uniformity, on a surface of the object, and can prevents dust particles from adhering to the object, thereby to increase the yield of devices made from the object.

According to the invention, to attain the object, there is provided a heat treatment apparatus comprising: a holder for holding a plurality of disk-shaped objects, each having an orientation flat portion at circumference, such that the objects are arranged coaxially and spaced at predetermined intervals, with the orientation flat portions aligned with one another; a hollow cylindrical cover having a plurality of gas ports, located to surround the objects held by the holder, and spaced from a circumference of each object by a predetermined distance; a flat plate mounted on an inner surface of the cover to oppose the orientation flat portions of the objects; and a process chamber in which the objects held by the holder are processed by using a process gas.

The cover may be comprised of a plurality of parts. Two of the parts of the cover may be secured to the holder. In this case, to transfer an object into the holder by means of an arm, the object must be inserted into the holder through one of two openings provided between said two of the parts.

Accordingly, in a preferred embodiment of the invention, the first opening is broader than the diameter of the objects, allowing the passage of the objects, and the second opening opposes the orientation flat portion of each object held in the holder and is broader than the width of the arm. The preferred embodiment has two cover members, the first of which is an arcuate cross section and the second of which is a flat plate. The first cover member covers the first opening. The second cover member covers the second opening and, therefore, opposes the orientation flat portion of each object held in the holder.

Each object is placed on the arm and held thereon under its own weight. If necessary, a stopper is provided on the distal end portion of the arm, for preventing the object from falling from the distal end of the arm.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is an exploded view of a boat cover, explaining how to attach the cover to the boat containing wafers;

DETAILED DESCRIPTION OF THE PREFERRED EMBODIMENTS

A vertical CVD apparatus, which is an embodiment of the present invention, will now be described in detail with reference to the accompanying drawings.

Figure 1:
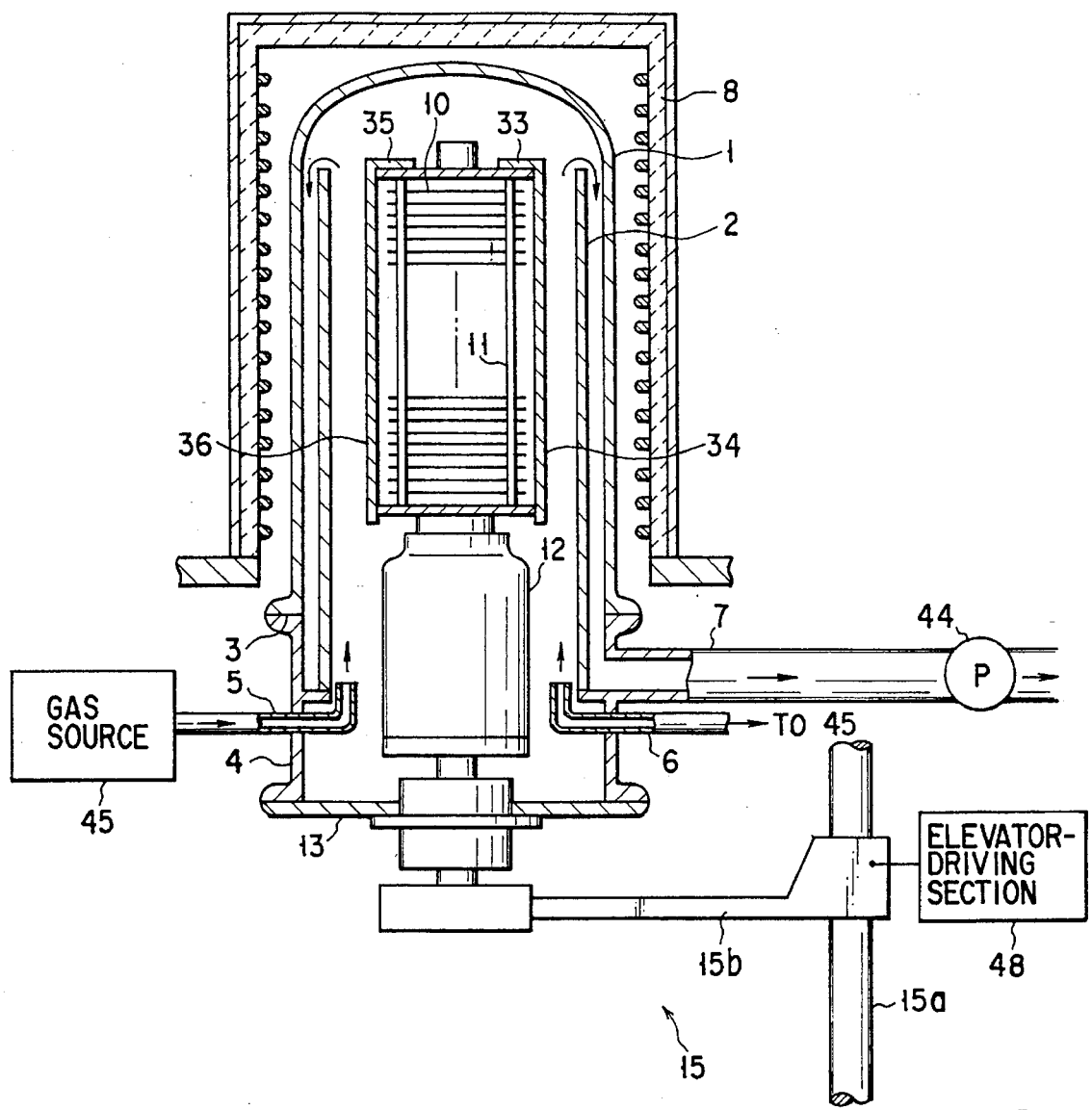
FIG. 1 is a sectional view of a vertical CVD apparatus which is an embodiment of the invention.

FIG. 1 shows the processing chamber of the vertical CVD apparatus. Provided in the processing chamber is a reaction tube 1 which is a hollow cylinder used as a reaction vessel. The reaction tube 1 is closed at the upper end and opened at the lower end. The tube 1 contains an inner tube 2 which is coaxial with the tube 1. Both the reaction tube 1 and the inner tube 2 are made of heat-resistant material such as quartz.

A manifold 4 is connected to the lower end of the reaction tube 1, with a resilient seal 3 (e.g., an O ring) interposed between the tube 1 and the manifold 4. The manifold 4 is made of corrosion-resistant metal such as stainless steel. Gas pipes 5 and 6 and an exhaust pipe 7 are connected at one end to the side of the manifold 4. The gas pipes 5 and 6 are connected, at the other end, to a process gas source 45. The exhaust pipe 7 is connected, at the other end, to a evacuation pump 44. When driven, the evacuation pump 44 evacuates the reaction tube 1 to a predetermined degree of vacuum.

The reaction tube 1 is surrounded by a hollow cylindrical resistance heater 8 which has at least three heating zones. The resistance heater 8 can set the temperature in the tube 1 at a desired heat-treatment temperature ranging from, for example, 500° to 1000° C.

A boat elevator 15 is located below the reaction tube 1, for moving up and down a boat 11 made of quartz which is a heat-resistant and corrosion-resistant material. The boat 11 contains a plurality of semiconductor wafers 10 (i.e. objects to be heat-treated in the reaction tube 1) which are located one above another and spaced apart form one another by a prescribed distance. The boat elevator 15 comprises a guide pole 15a and a support 15b. The guide pole 15a extends vertically. The support 15b extends horizontally and is slidably mounted on the pole 15a. The support 15b can be driven up and down by an elevator-driving section 48. A cover 13 is mounted on the support 15b, for closing the lower end of the reaction tube 1. A heat-insulating cylinder 12 is mounted on the support 15b, which supports the boat 11 at its top.

When driven by the elevator-driving section 48, the boat elevator 15 moves upwards to insert the boat 11 containing the wafers 10 into the reaction tube 1 through the lower end thereof, or moves downwards to remove the boat 11 from the reaction tube 1.

Figure 2:
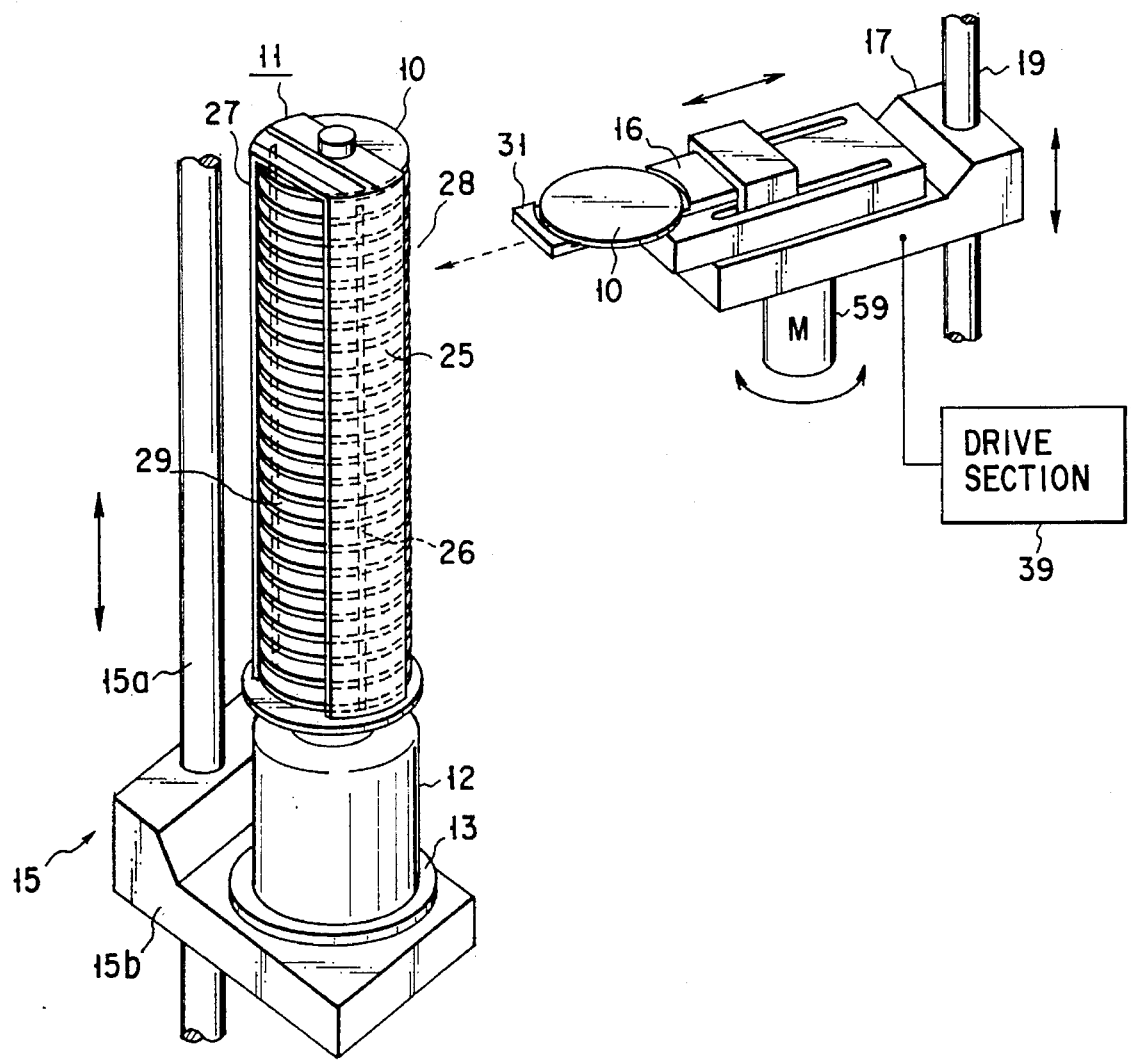
FIG. 2 is a perspective view of a wafer transfer device and a wafer boat, explaining how the wafer transfer device transfers a wafer to the wafer boat.

As shown in FIG. 2, a wafer transfer device 17 is installed adjacent to the boat elevator 15. The device 17 has an arm 16 for holding and transferring a wafer 10 to and from the boat 11. The wafer transfer device 17 can move up and down along a pole 19 and back and forth in a horizontal plane under the control of a drive section 39, as indicated by the arrows shown in FIG. 2. Further, the device 17 can rotated by an electric motor 59. The wafer 10 is placed onto the arm 16 and held thereon under its own weight while the arm 16 is located in a wafer receptacle (not shown). The arm 16 is moved from the wafer receptacle and inserted into the boat 11. The wafer 10 is thereby transferred into the boat 11.

Figure 3:
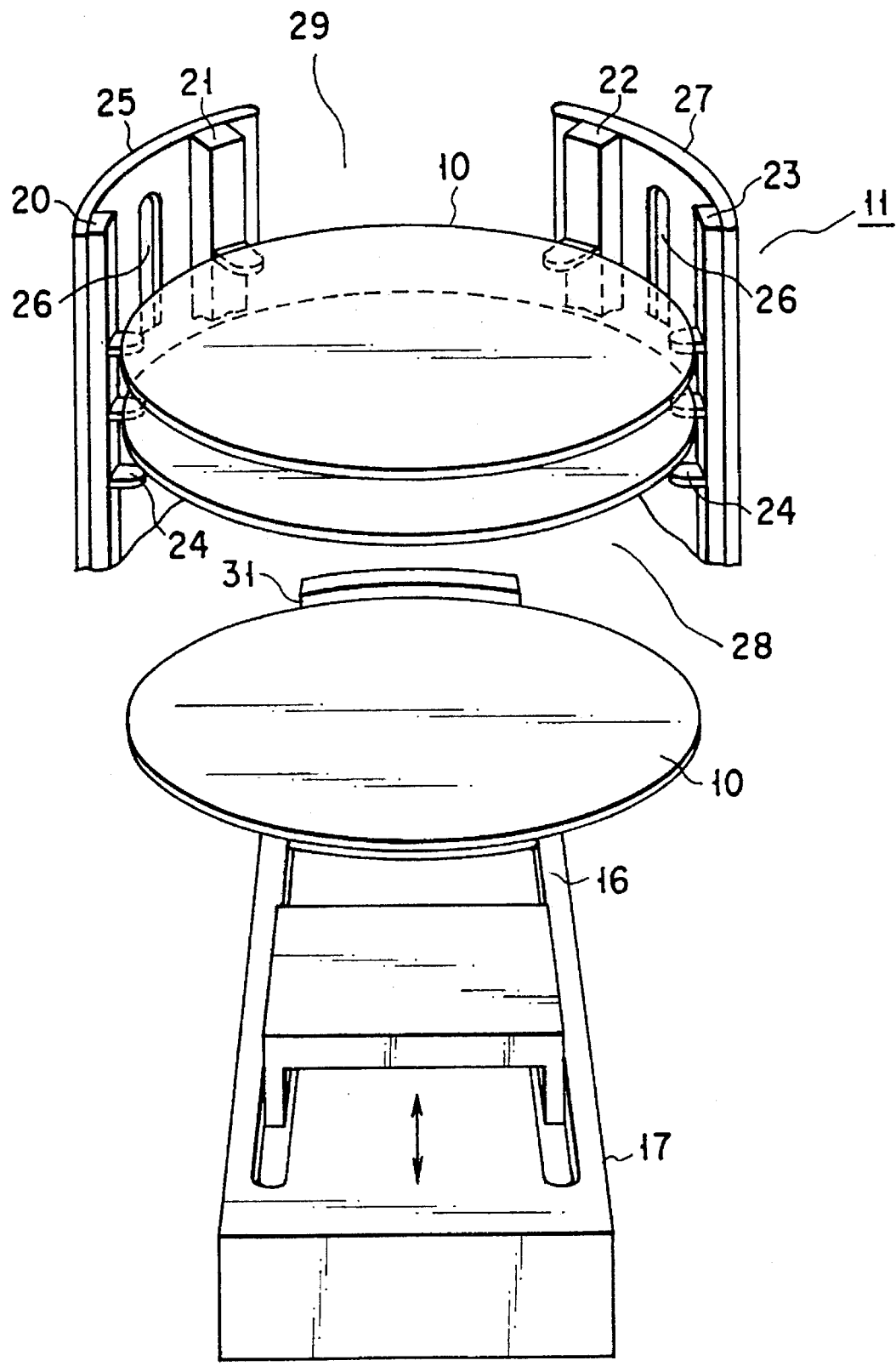
FIG. 3 is a perspective view of the wafer boat, as seen from the wafer port of the boat.

As shown in FIG. 3, the boat 11 has four poles 20 to 23, each having a rectangular cross section. Each of the poles 20 to 23 has projections 24 for supporting wafers. The boat 11 can contain a number of wafers, for example 120 wafers at most, holding each wafer in substantially horizontal position. A boat cover member 25 is welded to the poles 20 and 21, surrounding the wafers 10 contained in the boat 11 and spaced from the circumference of each wafer 10 by a distance of, for example, 10 mm. Another boat cover member 27 is welded to the poles 22 and 23, surrounding the wafers 10 contained in the boat 11 and spaced from the circumference of each wafer 10 by a distance of, for example, 10 mm. The boat cover members 25 and 27 have a slit 26 each, which extends vertically and has a width of 8 mm. It is through the slits 26 that a process gas can flow into and from the boat 11.

The boat cover members 25 and 27, both connected to the boat 11, define two rectangular openings 28 and 29. The opening 28 has a width greater than the diameter of the semiconductor wafers 10. Therefore, the semiconductor wafers 10 can be transferred into and from the boat 11 through this opening 28. The opening 29, which opposes the opening 28, has a width greater than that of the arm 16 of the wafer transfer device 17, so that the arm 16 abuts on neither the boat cover member 25 nor the boat cover member 27 when it transfers a wafer 10 into the boat 11.

Figure 4:
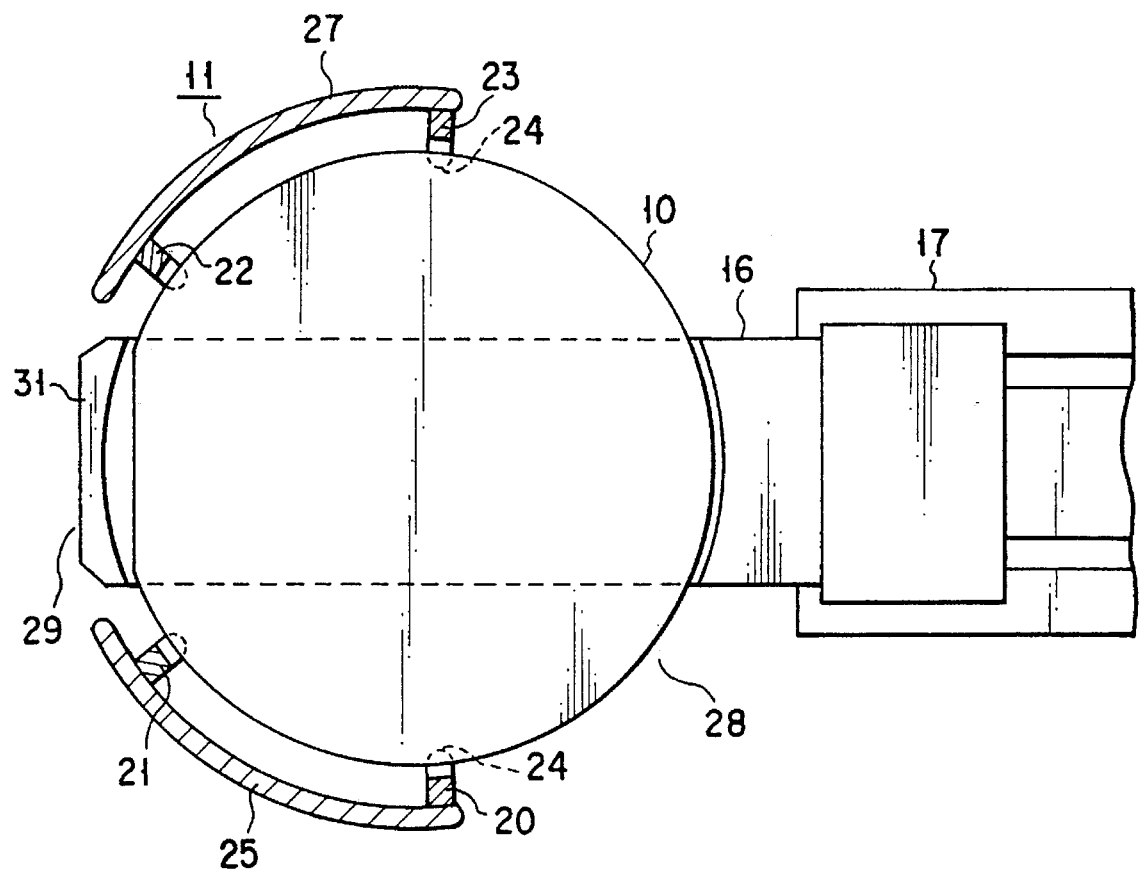
FIG. 4 is a plan view showing the arm of the wafer transfer device, which is inserted in the boat and which supports a semiconductor wafer.

FIG. 4 shows the arm 16 of the wafer transfer device 17, which is inserted in the boat 11 and which supports a semiconductor wafer 10. The arm 16 moves into the boat 11 through the broad opening 28. When the arm 16 reaches the position where the wafer 10 is set within the boat 11, with its orientation flat portion opposing the broad opening 28, the forward end portion of the arm 16 extends from the boat 11 through the narrow opening 29.

Figure 5:
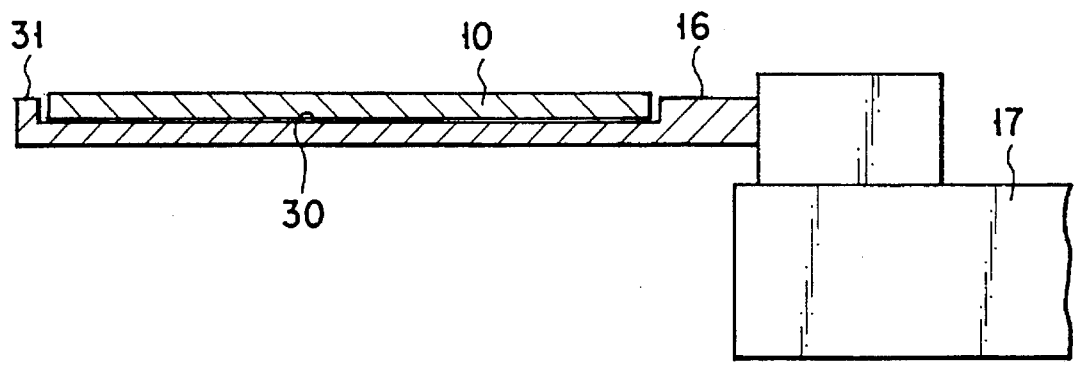
FIG. 5 is a transverse sectional view of the arm of the wafer transfer device.

FIG. 5 is a transverse sectional view of the arm 16. As can be understood from FIG. 5, the arm 16 is a rectangular plate and has in its upper surface a shallow and broad groove 30 for holding a semiconductor wafer 10. The arm 16 has a projection 31, which is curved along the waver 10 mounted on the arm 16 and which therefore prevents the wafer 10 from moving forward to fall from the arm 16. The semiconductor wafer 10 can therefore be steadily held in the groove 30, without using any vacuum suction device, and can be transferred to the boat 11 without fail.

After all semiconductor wafers 10 to be heat-treated have been set into the boat 11, two boar cover members 34 and 36 are attached to the boat 11, covering the openings 28 and 29, respectively, as illustrated in FIG. 6. The boat cover member 34 is one of the halves made by splitting a hollow cylinder along the axis thereof. The boat cover member 36 is a bar having a U-shaped cross section. The boat cover members 34 and 36 have arcuate members 33 and 35 at their upper ends, respectively. The arcuate members 33 and 35 are fitted in the upper end portion of the board 11 as long as the boat cover members 34 and 36 remain attached to the boat 11 and covering the openings 28 and 29, respectively. Once attached to the boat 11, both boat cover members 34 and 36 remain spaced from the circumference of each wafer 10 contained in the boat 11 by a distance of, for example, 10 mm. The boat cover member 34 has a slit 38 which extends vertically and through which a process gas can flow into and out of the boat 11. If necessary, the boat cover member 36 may have a vertical slit, too.

As can be understood from the foregoing, the boat 11 is surrounded by four boat cover members, i.e., the members 25 and 27 which are integral with the boat 11, and the members 34 and 36 which are removably attached to the boat 11. Any of the four boat cover members 25, 27, 34 and 36 are spaced from the circumference (including the orientation flat portion 37) of each semiconductor wafer 10 contained in the boat 11 by a distance of, for example, 10 mm.

It is desirable that the distance between each boat cover member and the circumference of each wafer 10 in the boat 11 be at least 5 mm and less than 20 mm. If the distance is less than 5 mm, the process gas will fail to flow thoroughly in the boat 11. If it is 20 mm or more, the active component of the process gas will be generated in the boat 11. In either case, there will be formed on the wafer 10 a thin film which has but insufficient thickness uniformity. Particularly preferable value for the distance is 10 mm. If the distance is 10 mm, a thin film having high thickness uniformity will be formed on the wafer 10, with good reproducibility.

Figure 7:
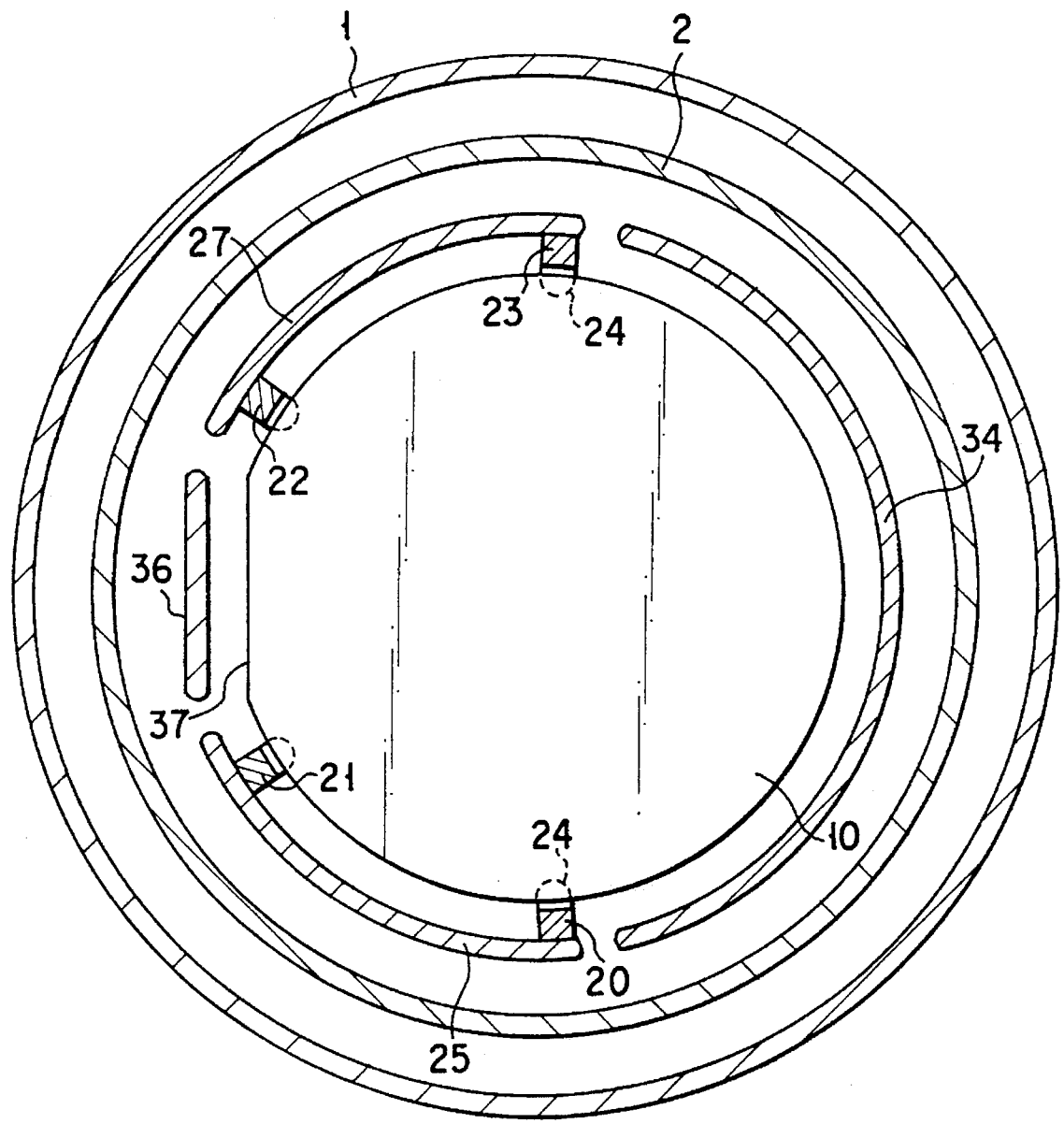
FIG. 7 is a transverse sectional view of the process chamber of the CVD apparatus, containing the boat which contains wafers and which is covered by the boat cover.

FIG. 7 shows the process chamber of the CVD apparatus and the boat 11 inserted in the process chamber. As shown in FIG. 7, semiconductor wafers 10 (only one seen) are contained in the boat 11. More precisely, the wafers 10 are contained in the inner tube 2 arranged within the reaction tube 1 and are surrounded by the four boat cover members 25, 27, 34 and 36, each spaced apart from the boat cover members by an equal distance.

It will now be explained how a semiconductor wafer 10 is transferred to the boat 11 and how a thin film is formed on the wafer 10.

First, the wafer 10 is removed from the wafer receptacle (not shown), such as a wafer cassette. It is then placed on the arm 16 of the wafer transfer device 17. The device 17 is moved up or down and rotated, thereby positioning the arm 16 in front of the broad opening 28 of the boat 11 and at a level, for example, 2 mm above the level at which the wafer 10 is to be located in the boat 11. Next, the wafer transfer device 17 is lowered by, for example, about 4 mm, moving the arm 16 downwards by the same distance. In this condition, the arm 16 is moved forward until the wafer 10 is mounted on the four projections 24 on the four 20 to 23. The arm 16 is then moved backward, whereby the semiconductor wafer 10 is mounted in the boat 11.

The sequence of operations, described above, is repeated until the boat 11 contains, for example, 120 semiconductor wafers 10.

After all wafers 10 to be heat-treated have been thus set into the boat 11, the arcuate member 33 of the boat cover member 34 and the arcuate member 36 of the boat cover member 36 are fitted into the upper end portion of the board 11. The boat cover members 34 and 36 are thereby attached to the boat 11 and cover the openings 28 and 29, respectively. This done, the boat elevator 15 is driven upwards, bringing the boat 11 to the prescribed ones of the heating regions within the reaction tube 1.

Then, a silicon oxide film is formed on each wafer 10 contained in the boat 11 by means of CVD method at a temperature of, for example, 820° C., as will be explained below.

The power supply to the heating zones of the resistance heater 8 is controlled such that the temperature is set at 820° C.±1° C. in at least those of the heating zones in which the boat 11 is now located. To be more precise, the temperature is set at 810° C. in the lower heating zone, 820° C. in the intermediate heating zone and 830° C. in the upper heating zone, for example. In this condition, 1000 SccM of nitrous oxide ($N_2O$) and 125 SccM of monosilane ($SiH_4$) are introduced into the reaction tube 1. The vacuum pump 44 evacuates the reaction tube 1 through the exhaust pipe 7, setting the pressure in the tube 1 at 0.8 Torr. The CVD method is continued for a predetermined period of time.

As indicated above, all boat cover members 25, 27, 34 and 36 are attached to the boat 11, each spaced from the circumference of each wafer 10 by the same distance. The process gas can therefore be introduced into the boat 11 through the gas pipes 5 and 6 and be subsequently distributed uniformly in the boat 11. Hence it is possible to form a silicon oxide film on the surface of each wafer 10—to a uniform thickness. This is attributable particularly to the boat cover member 36 which is a flat plate opposing the orientation flat portion 37 of each wafer 10 set in the boat 11 and which is spaced from the orientation flat by the same distance as the other boat cover members 25, 27 and 34 are spaced from the other circumferential portion of the wafer 10. Were the member 36 a half of a hollow cylinder, it should be more spaced from the orientation flat portion 37 than the other boat cover members 25, 27 and 34 are spaced from the other circumferential portion of the wafer 10.

Silicon oxide films were actually formed, in batches, on semiconductor wafers 10 by the vertical CVD apparatus according to the present invention in the same conditions as mentioned above. The silicon oxide films formed exhibited a thickness uniformity of ±3%. For comparison, silicon oxide films were formed, in batches, on semiconductor wafers 10 in the same conditions, but by a vertical CVD apparatus wherein the boat cover member 36 is a half of a hollow cylinder and spaced apart from the orientation flat portion 37 of each wafer 10 by a distance gradually changing from the 10 mm to 15 mm. The silicon oxide films formed by this apparatus had a lower thickness uniformity of ±4% to ±5%.

In the vertical CVD apparatus of this invention, dust particles were successfully prevented from adhering to each wafer 10 while the wafer 10 was being transferred. This is because the wafer 10 was made to "soft-land," under its own weight, on the arm 16 of the wafer transfer device 17, not held on the arm 16 by a vacuum suction means as in the conventional vertical CVD apparatus. More specifically, the wafer transfer device 17 transferred 120 wafers, one by one, from a wafer cassette to the boat 11, and transferred the wafers from the boat 11 back into the wafer cassette after they had been heat-treated the inner tube 2. Only five or less dust particles having a diameter of 0.2 μm or more had adhered onto each wafer transferred back into the wafer cassette.

For comparative purpose, in the conventional vertical CVD apparatus, the wafer transfer device having a vacuum suction means transferred 120 semiconductor wafers, one by one, from a wafer cassette to the boat, and hence back into the wafer cassette after they had been heat-treated. As many as 30 to 50 dust particles having a diameter of 0.2 μm or more had adhered onto each wafer transferred back into the wafer cassette.

As described above, the vertical CVD apparatus of this invention has four boat cover members, i.e., the member 25 welded to the poles 20 and 21, the member 27 welded to the poles 22 and 23, and two other members 34 and 36 both attached to the boat 11. Instead, the apparatus may have more or less than four boat cover members. Furthermore, the boat cover members 25, 27, 34 and 36 may be replaced by a single boat cover member, as will be described later.

The arm 16 of the wafer transfer device 17 can support only one semiconductor wafer 10 at a time. The device 17 may have two or more arms 16 so as to transfer a plurality of wafers 10 at the same time. For instance, the wafer transfer device 17 may have five arms 16. In this case, five wafers 10 can be simultaneously transferred to the boat 11. These arms 16 may be arranged one above another, at predetermined intervals, and the device 17 may comprise a mechanism for changing the intervals. If this instance, the wafer transfer device 17 can transfer wafers 10, even if the intervals at which the wafers 10 are set in a cassette differ from the intervals at which they are contained in the boat 11.

Figure 8:
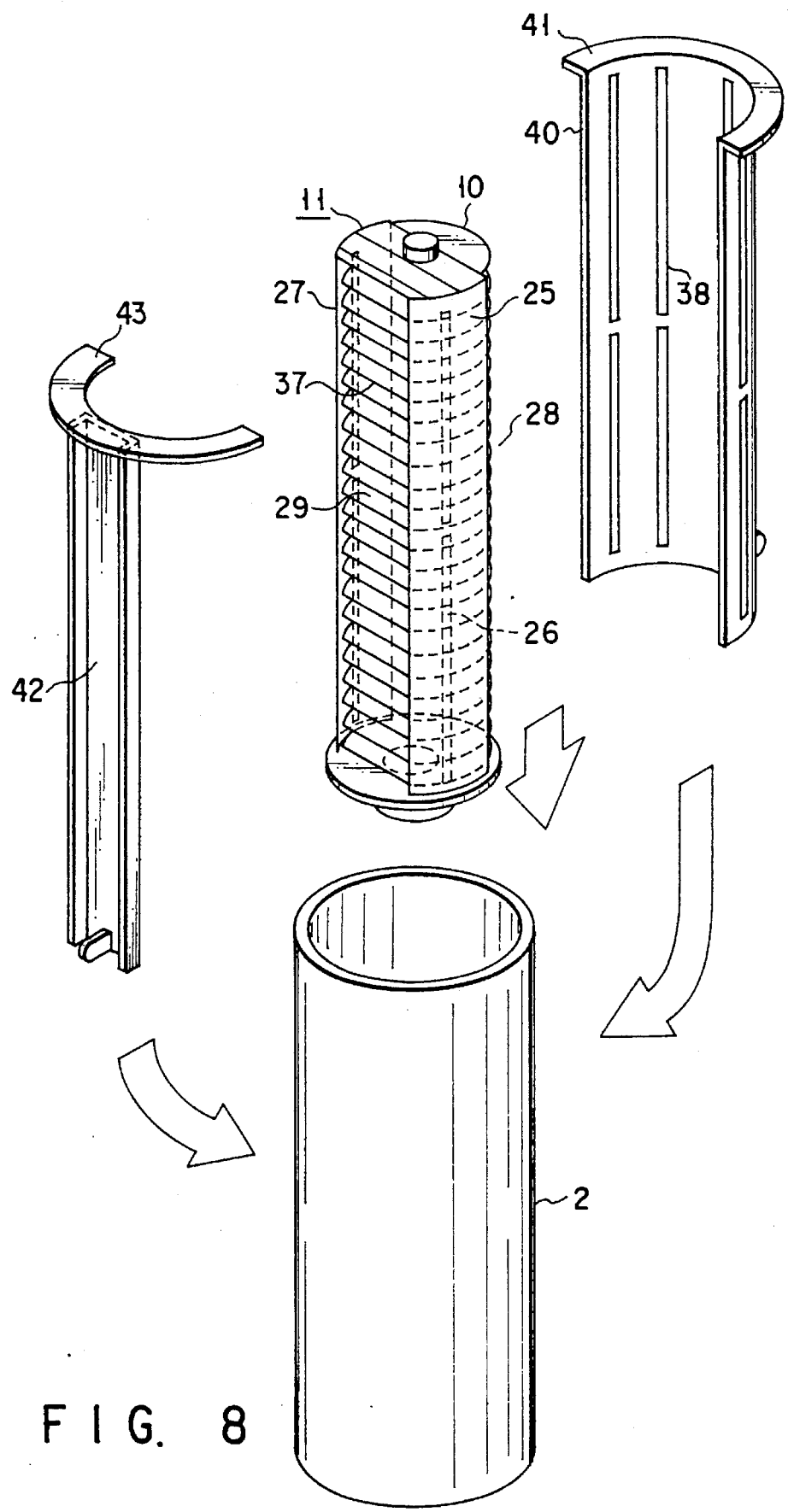
FIG. 8 is an exploded view of a first modified boat cover, explaining how to attach this cover to the boat containing wafers.

FIG. 8 shows a first modified boat cover which comprises two boat cover members 40 and 42. The member 40, which is used to cover the broad opening 28 of the boat 11, has an arcuate member 41 connected to its upper end. The arcuate member 41 horizontally extends outwardly, not inwardly as the arcuate member 33 of the boat cover member 34 (FIG. 6). The boat cover member 42, which is used to cover the narrow opening 29 of the boat 11, has an arcuate member 43 connected to its upper end. The middle part of the arcuate member 43 horizontally extends outwardly. The arcuate members 41 and 43 are mounted on the upper end of the inner tube 2, whereby the boat cover members 40 and 43 vertically extend along the inner surface of the tube 2. In this case, too, the members 40 and 42 are spaced from the circumference of each wafer 10 set in the boat 11 at a predetermined distance of, for example, 10 mm.

When the modified boat cover shown in FIG. 8 is attached to the boat 11, the boat 11 cannot be rotated as will be explained with reference to FIG. 10, since the orientation flat portion of each wafer diverges its position with respect to the boat cover member 42 if the boat 11 is rotated. Semiconductor wafers 10 were subjected to CVD process in the same conditions described above in the vertical CVD apparatus according to the invention, while being contained in the boat 11 covered by the modified boat cover of FIG. 8, not by the boat cover of FIG. 6. The silicon oxide films formed on the wafers 10 had a high thickness uniformity of ±3% as in the case where the boat 11 was rotated during the CVD process.

The boat cover members 40 and 42 may be welded to the inner tube 2. In this case, the members 40 and 42 can be more easily incorporated into and removed from the CVD apparatus, and can be more readily washed.

Figure 9:
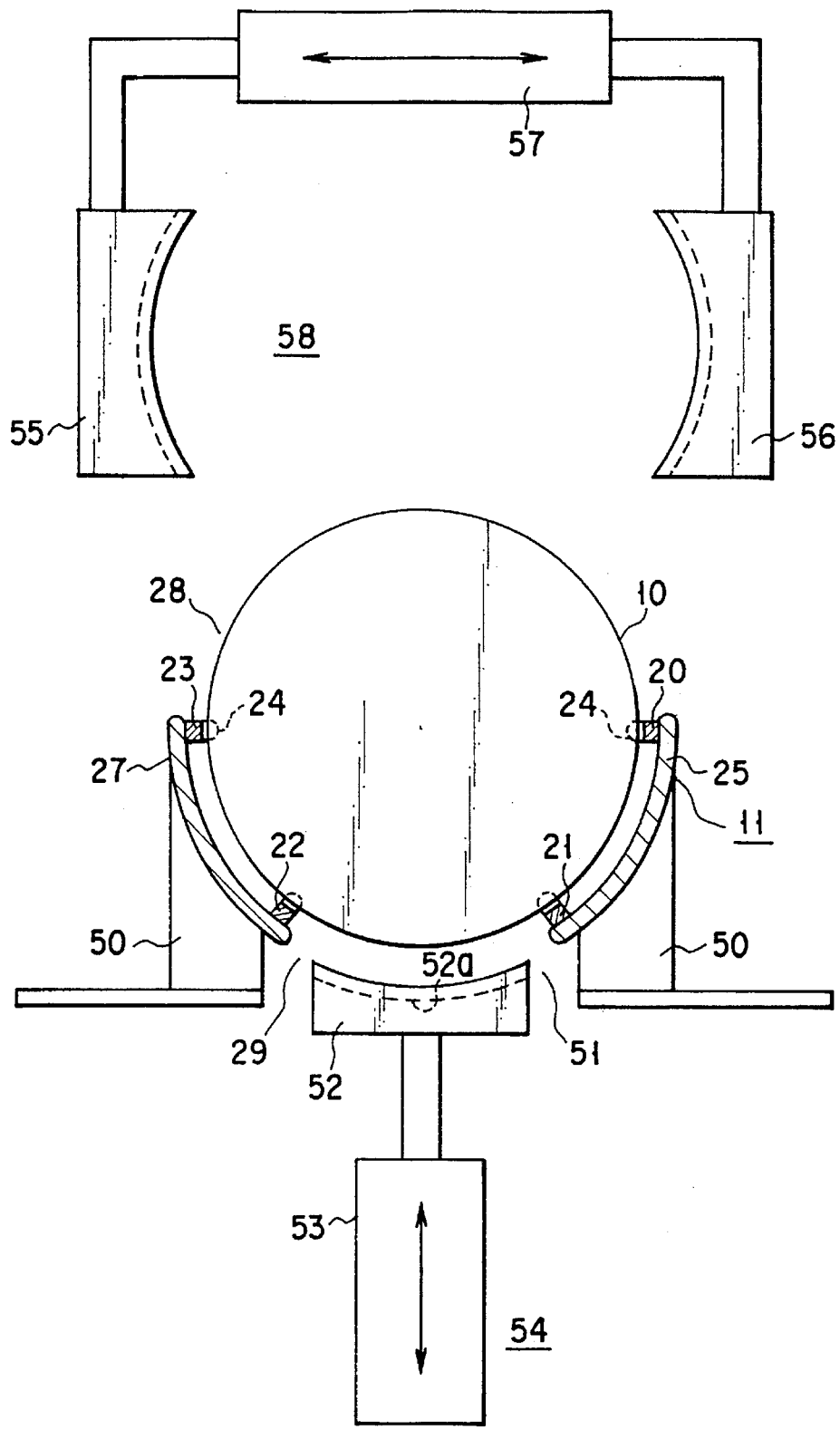
FIG. 9 is a plan view showing a modification of the wafer transfer device.

FIG. 9 shows a modification of the wafer transfer device 17. The modification comprises a boat table 50, a wafer elevator 54 located below the table 50, and a wafer clamp 58 located above the table 50. The table 50 has an opening 51 in the central part. The wafer elevator 54 comprises a wafer holder 52 having a groove 52a, and a drive mechanism 53 for driving the wafer holder 52. The wafer clamp 58 comprises two clamps 55 and 56 and clamp-driving mechanism 57 for driving the clamps 55 and 56 toward and away from each other.

It will be explained how the modified wafer transfer device transfers semiconductor wafers 10 one by one.

First, the drive mechanism 53 is actuated, driving the wafer holder 52 upwards. As the wafer holder 52 is so driven, it receives a wafer 10 in the groove 52a and brings the wafer 10 into the gap between the clamps 55 and 56. Then, the clamp-driving mechanism 57 is actuated, driving the clamps 55 and 56 toward each other. The wafer 10 is thereby held between the clamps 55 and 56. The drive mechanism 53 of the wafer elevator 54 is actuated, driving the wafer holder 52 downwards.

The sequence of operations, described in the preceding paragraph, is repeated to transfer other semiconductor wafers 10 from the boat 11.

Figure 10:
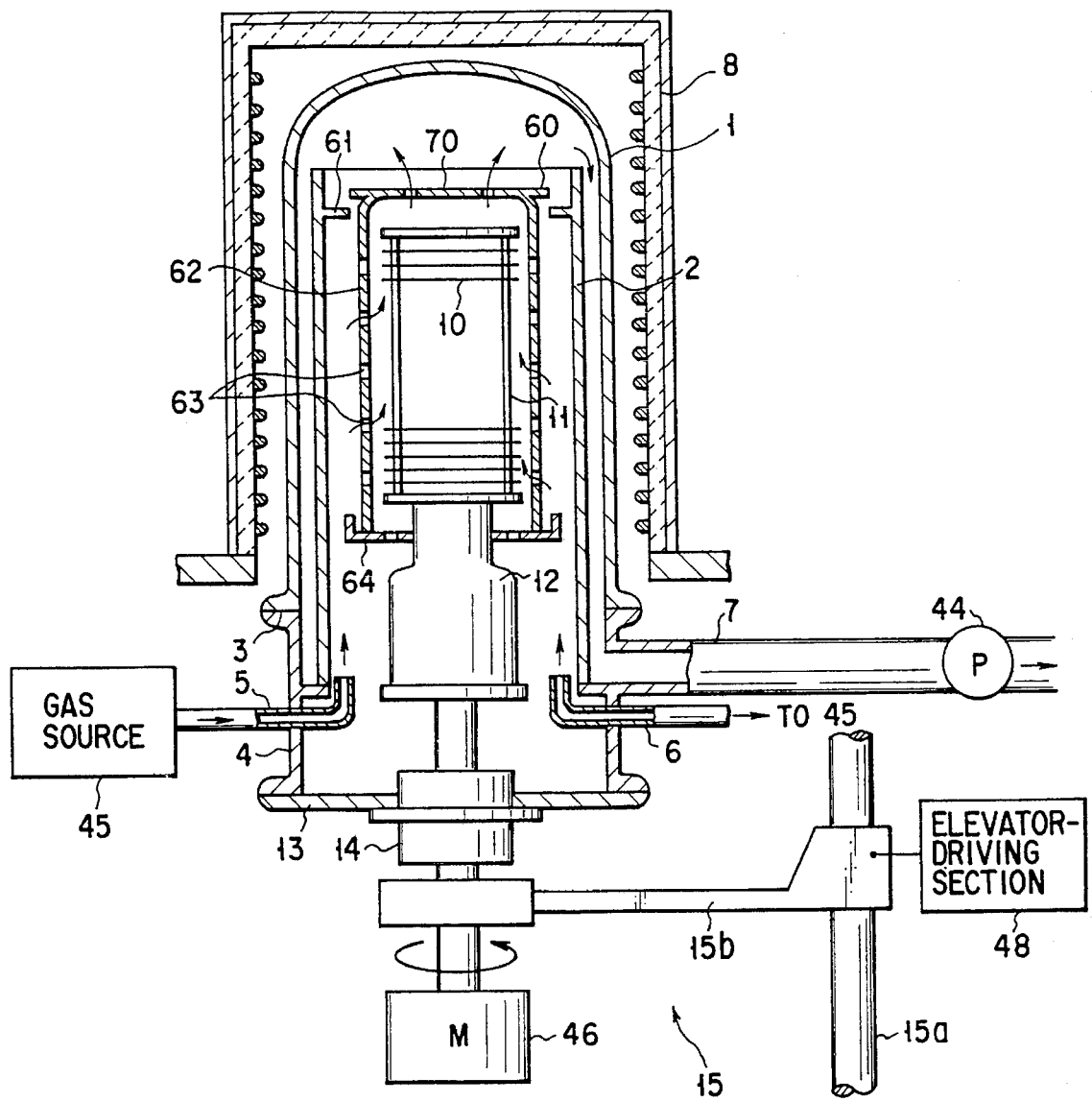
FIG. 10 is another sectional view of the vertical CVD apparatus of the invention, showing a boat which is located within the CVD apparatus and which has a second modified boat cover attached to it.
Figure 11:
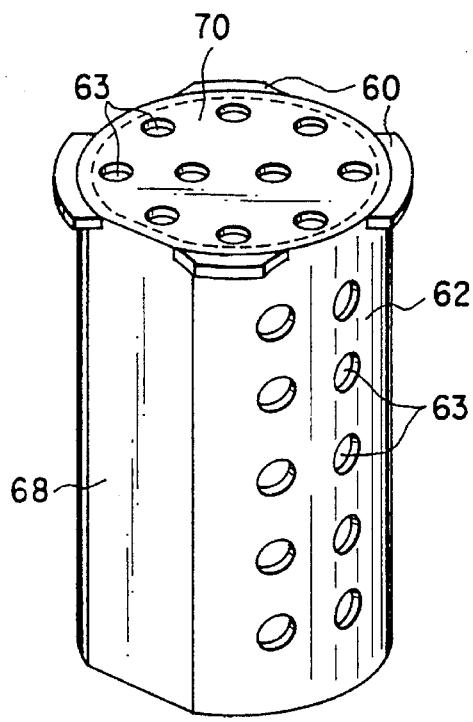
FIG. 11 is a perspective view of the second modified boat cover.
Figure 12:
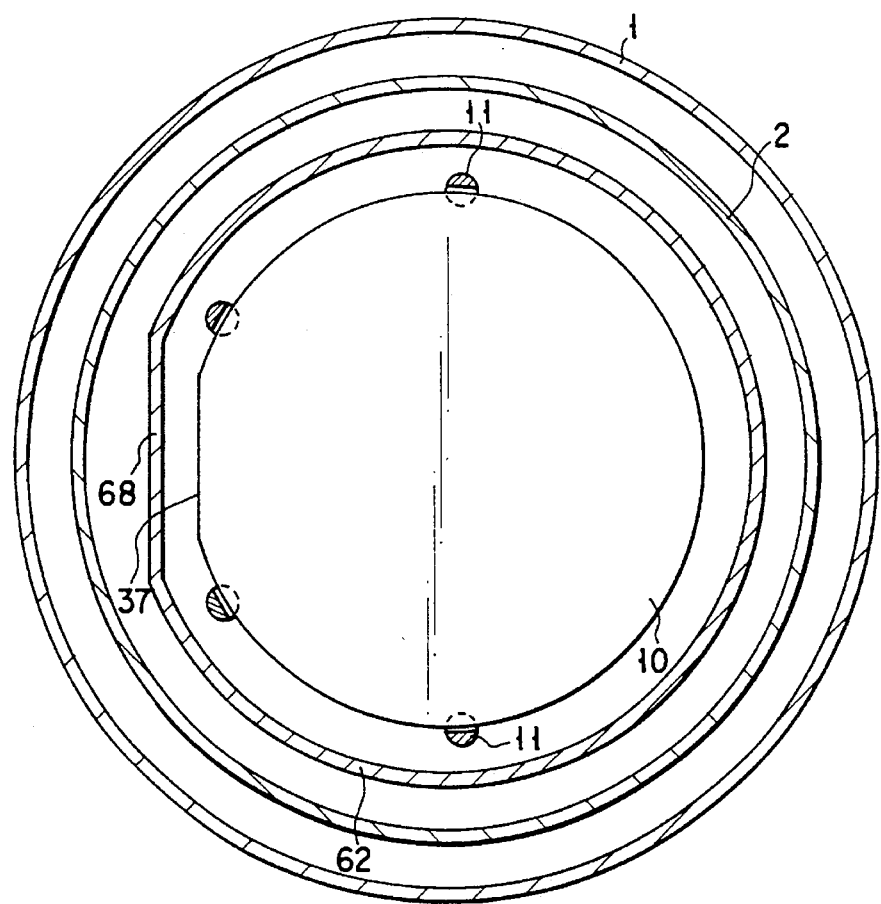
FIG. 12 is a transverse sectional view showing the wafer boat covered by the boat cover shown in FIG. 11.

FIGS. 10 to 12 show a second modified boat cover. FIG. 10 is a sectional view of the vertical CVD apparatus of the invention, showing the second modified boat cover 62 located in the reaction tube 1 of the CVD apparatus. The components identical to those shown in FIG. 1 are designated at the same reference numerals and will not described in detail.

As shown in FIG. 10, the boat cover 62 is arranged in the inner tube 2, surrounding the boat 11. As shown in FIG. 11, the boat cover 62 comprises a hollow cylinder and a top plate 70. The hollow cylinder is made of heat-resistant material such as quartz. The top plate 70 closes the upper end of the hollow cylinder. The boat cover 62 is left open at its lower end. The boat 11 can therefore be inserted into and removed from the boat cover 62 via the lower end thereof. The boat cover 62 has holes 63 made in its side wall and also in its top plate 70. The shape, size and position of each hole 63 are determined by various parameters, such as the type of the process gas used and the heat-treatment temperature selected.

A rotary mechanism 14 is mounted on the support 15b. A cover 13 is mounted on the circumferential surface of the rotary mechanism 14, for closing the lower end of the reaction tube 1. The heat-insulating cylinder 12 is mounted on the rotary mechanism 14, which supports the boat 11 at its top. When driven by an electric motor 46, the rotary mechanism 14 rotates the boat 11 at a predetermined speed.

The top plate 70 has four projections 60 which extend horizontally. As shown in FIG. 10, the inner tube 2 has four projections 61 protruding horizontally from the inner surface of the tube 2. To place the boat cover 62 in a proper position within the inner tube 2, the cover 62 is lifted into the tube 2 until the projections 60 reach a position a little above the projections 61, then rotated, bringing the projections 60 into vertical alignment with the projections 61, and finally lowered until the projections 60 rest on the projections 61. To remove the boat cover 62 from the inner tube 2, the cover 62 is moved upward a little, then rotated to set the projections 60 out of the vertical alignment with the projections 61, and finally lowered.

As shown in FIG. 10, an annular support 64 is mounted on the heat-insulating cylinder 12, which is turn is mounted on the rotary mechanism 14. When the boat 11 containing wafers 10 is transferred into the reaction tube 1, the annular support 64 abuts on the lower end of the boat cover 62, pushing the boat cover 62 upwards. As a result, the boat cover 62 is raised and disengaged from the inner tube 2, while being supported by the annular support 64. The rotary mechanism 14 is driven in this condition, rotating the boat 11 and the cover 62 together.

The semiconductor wafers 10 set in the boat 11, one above another, with their orientation flat portions 37 aligned together as illustrated in FIG. 12. The boat 11 remains concentric to the inner tube 2 while it is located within the boat cover 62, and that part of the boat cover 62 which opposes the orientation flat portions 37 is a flat vertical wall 68. Hence, any part of the boat cover 62 is spaced from the circumference (including the portion 37) of each semiconductor wafer 10 by the same distance of, for example, 10 mm.

The second modified boat cover 62 can achieve the same advantage as the other the first modified boat cover (FIG. 8), since any part of its is spaced from the circumference of each wafer 10 by the same distance. That is, it serves to form thin films, such as silicon oxide films, which have sufficiently high thickness uniformity.

The present invention is not limited to the embodiments described above. Rather, it can be applied to CVD method of forming phosphorus-added polysilicon films, boron-added silicate glass films and the like, which would otherwise fail to have high thickness uniformity. The invention can be applied not only to CVD method, but also to other film-forming heat treatments, such as thermal oxidation and impurity diffusion. Moreover, this invention can be applied to other process using a process gas, such as dry etching.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A heat treatment apparatus comprising:

a holder for holding a plurality of disk-shaped objects layered one upon the other in a vertical direction such that the objects are arranged coaxially and spaced at predetermined intervals, each of said objects having an orientation flat portion at a circumference thereof, with said holder holding said objects with the orientation flat portions aligned with one another to form a column of orientation flat portions;

a process chamber in which the objects held by said holder are processed by using a process gas; and a hollow cylindrical cover surrounding an entire circumferential surface of the plurality of objects held by said holder with a predetermined distance provided between said cover and said circumferential surface, said cover having a plurality of gas ports permitting said process gas introduced into said process chamber to flow inward to reach a region where the objects held by the holder are positioned, said gas ports serving to control the amount of the process gas which is brought into contact with the objects;

wherein an inner surface portion of said cover which faces the column of the orientation flat portions of said plurality of objects is a flat surface.

2. A heat treatment apparatus according to claim, 1, wherein said cover is comprised of a plurality of parts.

3. A heat treatment apparatus according to claim 2, wherein at least one of the parts of said cover is secured to said holder, and the other parts of said cover are removably held in said process chamber.

4. A heat treatment apparatus according to claim 2, wherein at least one of the parts of said cover is secured to said holder, and the other parts of said cover are removably attached to said holder.

5. A heat treatment apparatus according to claim 1, further comprising a rotary mechanism for rotating said holder in said processing chamber.

6. A heat treatment apparatus according to claim 1, wherein said cover has a top member having a plurality of gas ports.

7. A heat treatment apparatus according to claim 2, further comprising an arm for transferring the objects to said holder, wherein said cover comprises two cover members secured to said holder, each for covering a part of the circumference of each object held in said holder, a flat cover member opposing the orientation flat portions of the objects held in said holder, and a curved cover member having an arcuate cross section; two openings are provided between the cover members secured to said holder, the first opening being broader than the diameter of the objects and allowing the passage of the objects, and the second opening opposing the orientation flat portion of each object held in the holder and being broader than the width of said transfer arm; said curved cover member is arranged to cover the first opening; and said flat cover member is arranged to cover the second opening.

8. A heat treatment apparatus according to claim 7, further comprising a stopper provided on a distal end portion of said transfer arm, for preventing the object from falling from a distal end of said transfer arm.

9. A heat treatment apparatus according to claim 7, wherein said curved cover member and said flat cover member are removably attached to said holder.

10. A heat treatment apparatus according to claim 7, wherein said curved cover member and said flat cover member are removably held in said processing chamber.

11. A heat treatment apparatus comprising:

a holder for holding a plurality of disk-shaped objects layered one upon the other in a vertical direction such that the objects are arranged coaxially and spaced at predetermined intervals, each of said objects having an orientation flat portion at a circumference thereof, with said holder holding said objects with the orientation flat portions aligned with one another to form a column of orientation flat portions;

a process chamber in which the objects held by said holder are processed by using a process gas; and two fixing covers secured to said holder with a predetermined distance provided between said covers and a layer of said objects formed within said process chamber, said two fixing covers surrounding a part of a circumference of the layer of said objects over an entire length of the layer and having a plurality of gas ports permitting said process gas introduced into said process chamber to flow inward to reach a region where the objects held by the holder are positioned, said gas ports serving to control the amount of the process gas which is brought into contact with the objects;

a transfer arm for transferring said objects onto said holder;

a first opening, provided between said two fixing covers and having a width larger than a diameter of the objects, for allowing said transfer arm to transfer the objects into and out of said holder;

a second opening, provided between said two fixing covers and having a width larger than a width of said transfer arm and opposing said first opening and the orientation flat portions of the objects; and a flat cover arranged in said second opening with a predetermined distance provided between said flat cover and the column of the orientation flat portions of said objects.

12. A heat treating method, comprising the steps of:

transferring with a transfer arm a plurality of disk-shaped objects set in an object housing section toward an object holder which is surrounded by a cover body, wherein said cover body is provided with a first opening having a width larger than a width of said objects and a second opening having a width larger than a width of said transfer arm, said cover body further having a plurality of gas ports;

transferring the objects through said first opening into said cover body with said transfer arm;

setting the objects on said object holder by protruding a tip portion of said transfer arm into said cover through said second opening such that an orientation flat portion of each object formed by horizontally cutting a peripheral portion of each object is positioned to face the second opening and positioned a predetermined distance apart from said cover body;

coaxially layering in a vertical direction the objects one upon the other with a predetermined distance provided therebetween within the object holder to form a layer of the objects with orientation flat portions of the objects forming a column of orientation flat portions, followed by arranging a first cover provided with a plurality of gas ports in said first opening such that said first cover faces the layer of the objects with a predetermined distance provided therebetween, and arranging a flat plate-like second cover provided with a plurality of gas ports in said second opening such that said second cover faces the column of orientation flat portions of the objects with a predetermined distance provided therebetween; and transferring the object holder surrounded by said cover body, first cover and second cover into a process chamber for applying a predetermined heat treatment to the objects set in the object holder.

13. A heat treatment apparatus according to claim 11, wherein said flat cover is removably attached to said holder.

14. A heat treatment apparatus according to claim 11, wherein said flat cover is removably held in said processing chamber.

15. A heat treatment apparatus according to claim 11, further comprising a curved cover which has an arcuate cross section and which is arranged to cover said first opening.

16. A heat treatment apparatus according to claim 15, wherein said curved cover is removably attached to said holder.

17. A heat treatment apparatus according to claim 15, wherein said curved cover is removably held in said processing chamber.

18. A heat treatment apparatus according to claim 11, wherein each of the objects is mounted on said transfer arm under a weight of the object.

19. A heat treatment apparatus according to claim 11, further comprising a stopper provided on a distal end portion of said transfer arm, for preventing the object from falling from a distal end of said transfer arm.

* * * * *